United States Patent
Ramakrishnan et al.

(10) Patent No.: US 9,223,201 B2
(45) Date of Patent: *Dec. 29, 2015

(54) METHOD OF MANUFACTURING A PHOTOMASK WITH FLEXOGRAPHY

(71) Applicant: Uni-Pixel Displays, Inc., The Woodlands, TX (US)

(72) Inventors: Ed S. Ramakrishnan, Spring, TX (US); Robert J. Petcavich, The Woodlands, TX (US)

(73) Assignee: UNI-PIXEL DISPLAYS, INC., Santa Clara, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 13/929,533

(22) Filed: Jun. 27, 2013

(65) Prior Publication Data

US 2015/0004530 A1    Jan. 1, 2015

(51) Int. Cl.
| | |
|---|---|
| *G03F 1/00* | (2012.01) |
| *G03F 1/92* | (2012.01) |
| *B41C 1/05* | (2006.01) |
| *B41N 1/12* | (2006.01) |

(52) U.S. Cl.
CPC ... *G03F 1/92* (2013.01); *B41C 1/05* (2013.01); *B41N 1/12* (2013.01)

(58) Field of Classification Search
CPC .............................. G03F 7/202; G03F 7/70875
USPC .......................................................... 430/306
See application file for complete search history.

(56) References Cited

U.S. PATENT DOCUMENTS

| | | |
|---|---|---|
| 6,605,410 B2 | 8/2003 | Yang et al. |
| 7,718,352 B2 | 5/2010 | Tachikawa et al. |
| 8,384,691 B2 | 2/2013 | Frey et al. |
| 2002/0170451 A1 | 11/2002 | Nakazawa et al. |

(Continued)

FOREIGN PATENT DOCUMENTS

| | | |
|---|---|---|
| EP | 2313270 B1 | 1/2013 |
| WO | 2012010459 A1 | 1/2012 |

OTHER PUBLICATIONS

International Search Report of the International Searching Authority (Korea) for corresponding international application PCT/US2013/078297 dated Apr. 22, 2014.

(Continued)

*Primary Examiner* — Chanceity Robinson
(74) *Attorney, Agent, or Firm* — Basil M. Angelo

(57) ABSTRACT

A method of manufacturing a flexographic printing plate includes designing a photomask patterned design. The photomask patterned designed is laser-ablated into a thermal imaging layer. The laser-ablated thermal imaging layer is laminated to a top side of a flexographic printing plate substrate. A bottom side of the flexographic printing plate substrate is exposed to UV-A radiation. The top side of the flexographic printing plate substrate is exposed to UV-A radiation. The thermal imaging layer is removed. The flexographic printing plate substrate is developed. A flexographic printing system for printing a photomask includes an ink roll, an anilox roll, a printing plate cylinder, a flexographic printing plate disposed on the printing plate cylinder, and an impression cylinder. The flexographic printing plate comprises embossing patterns corresponding to a photomask patterned design. The flexographic printing plate may be used in a flexographic printing system to manufacture a photomask with flexography.

10 Claims, 6 Drawing Sheets

(56) References Cited

U.S. PATENT DOCUMENTS

| | | | |
|---|---|---|---|
| 2003/0129533 A1 | 7/2003 | Goodin et al. | |
| 2004/0079246 A1 | 4/2004 | Davis et al. | |
| 2008/0314271 A1* | 12/2008 | Goldfarb | 101/401.1 |
| 2010/0028815 A1 | 2/2010 | Zwadlo | |
| 2010/0112311 A1 | 5/2010 | Kobayashi et al. | |
| 2010/0151387 A1 | 6/2010 | Blanchet et al. | |
| 2010/0282102 A1 | 11/2010 | Mehdizadeh | |
| 2013/0242276 A1 | 9/2013 | Schadebrodt et al. | |

OTHER PUBLICATIONS

Written Opinion of the International Searching Authority (Korea) for corresponding international application PCT/US2013/078297 dated Apr. 22, 2014.

International Search Report of the International Searching Authority (Korea) for international application PCT/US2013/078325 dated Apr. 14, 2014.

International Search Report of the International Searching Authority (Korea) for international application PCT/US2013/078333 dated Apr. 24, 2014.

International Search Report of the International Searching Authority (Korea) for international application PCT/US2013/078344 dated Jun. 27, 2014.

Written Opinion of the International Searching Authority (Korea) for international application PCT/US2013/078325 dated Apr. 14, 2014.

Written Opinion of the International Searching Authority (Korea) for international application PCT/US2013/078333 dated Apr. 24, 2014.

Written opinion of the International Searching Authority (Korea) for international application PCT/US2013/078344 dated Jun. 27, 2014.

* cited by examiner

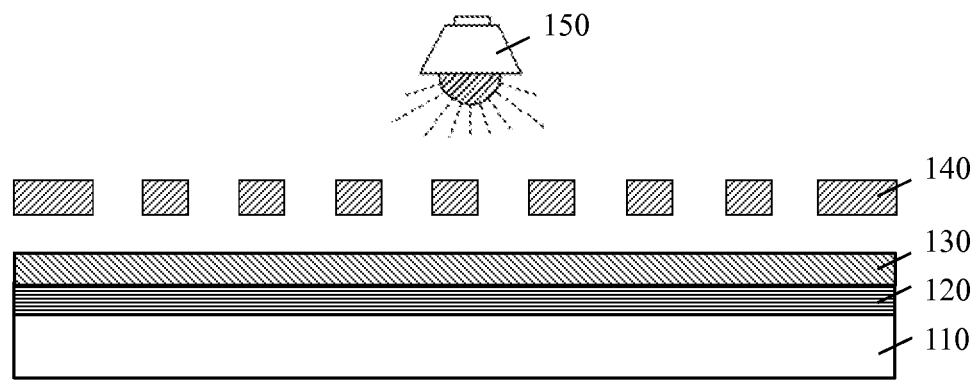
FIG. 1A
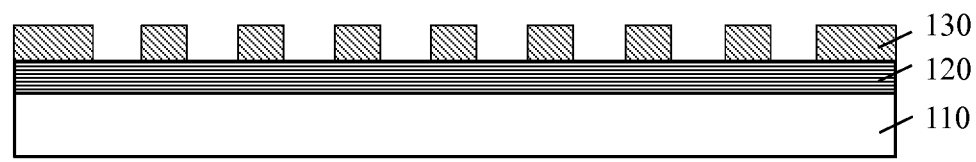
FIG. 1B
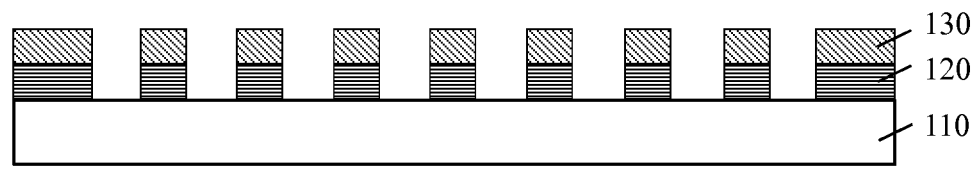
FIG. 1C
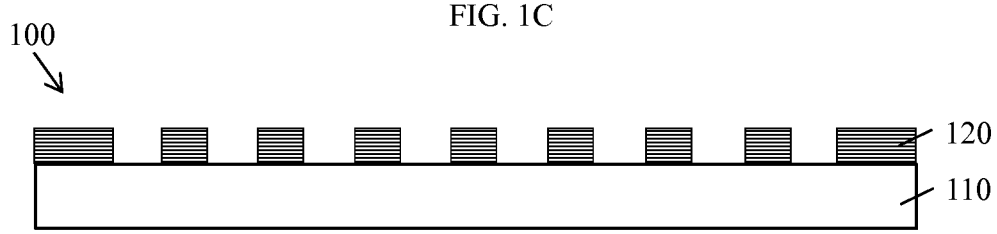
FIG. 1D
PRIOR ART
FIG. 1

METHOD OF MANUFACTURING A PHOTOMASK WITH FLEXOGRAPHY

BACKGROUND OF THE INVENTION

Photolithography is a patterning process in which a patterned design is transferred from a photomask to a photoresist material as part of a substrate patterning process. The photomask is a lithographic template that includes the patterned design to be transferred to the photoresist material. Conventionally, the photomask includes an opaque surface with a plurality of open or radiation transparent portions that form the patterned design to be transferred. Radiation incident on the photomask passes through the open portions of the photomask to expose portions of the photoresist material in a pattern corresponding to the open portions of the photomask. Radiation incident on the opaque surface of the photomask does not pass through the photomask and the photoresist material remains unexposed in a pattern corresponding to the opaque surface of the photomask.

If positive photoresist material is used, the exposed portions of the photoresist material are removed by a photoresist developer, while the unexposed portions of the photoresist material remain on the substrate. If negative photoresist material is used, the exposed portions of the photoresist material remain on the substrate, while the unexposed portions of the photoresist material are removed by a photoresist developer. After development, one or more physically exposed portions of the substrate may be patterned by an etching process, while physically unexposed portions of the substrate remain covered by the photoresist material. After etching, remaining portions of the photoresist material are removed. In operation, the photomask may be used to replicate a patterned design on a plurality of substrates as part of the substrate patterning process. Depending on the type of photoresist used (positive or negative) and the type of photomask used (i.e., bright field or dark field), the photomask may be used to replicate a positive image of the photomask patterned design or a negative image of the photomask patterned design on one or more substrates. Photomasks are commonly used in the fabrication of semiconductor devices.

BRIEF SUMMARY OF THE INVENTION

According to one aspect of one or more embodiments of the present invention, a method of manufacturing a flexographic printing plate includes designing a photomask patterned design. The photomask patterned designed is laser-ablated into a thermal imaging layer. The laser-ablated thermal imaging layer is laminated to a top side of a flexographic printing plate substrate. A bottom side of the flexographic printing plate substrate is exposed to UV-A radiation. The top side of the flexographic printing plate substrate is exposed to UV-A radiation. The thermal imaging layer is removed. The flexographic printing plate substrate is developed.

According to one aspect of one or more embodiments of the present invention, a flexographic printing system for printing a photomask includes an ink roll, an anilox roll, a printing plate cylinder, a flexographic printing plate disposed on the printing plate cylinder, and an impression cylinder. The flexographic printing plate comprises embossing patterns corresponding to a photomask patterned design.

According to one aspect of one or more embodiments of the present invention, A method of manufacturing a photomask includes transferring an ink from an anilox roll to a flexographic printing plate. The ink is transferred from the flexographic printing plate to a photomask substrate. The flexographic printing plate includes embossing patterns corresponding to a photomask patterned design.

Other aspects of the present invention will be apparent from the following description and claims.

BRIEF DESCRIPTION OF THE DRAWINGS

FIG. 1 shows a cross-sectional view of a conventional photomask.

DETAILED DESCRIPTION OF THE INVENTION

Figure 2:
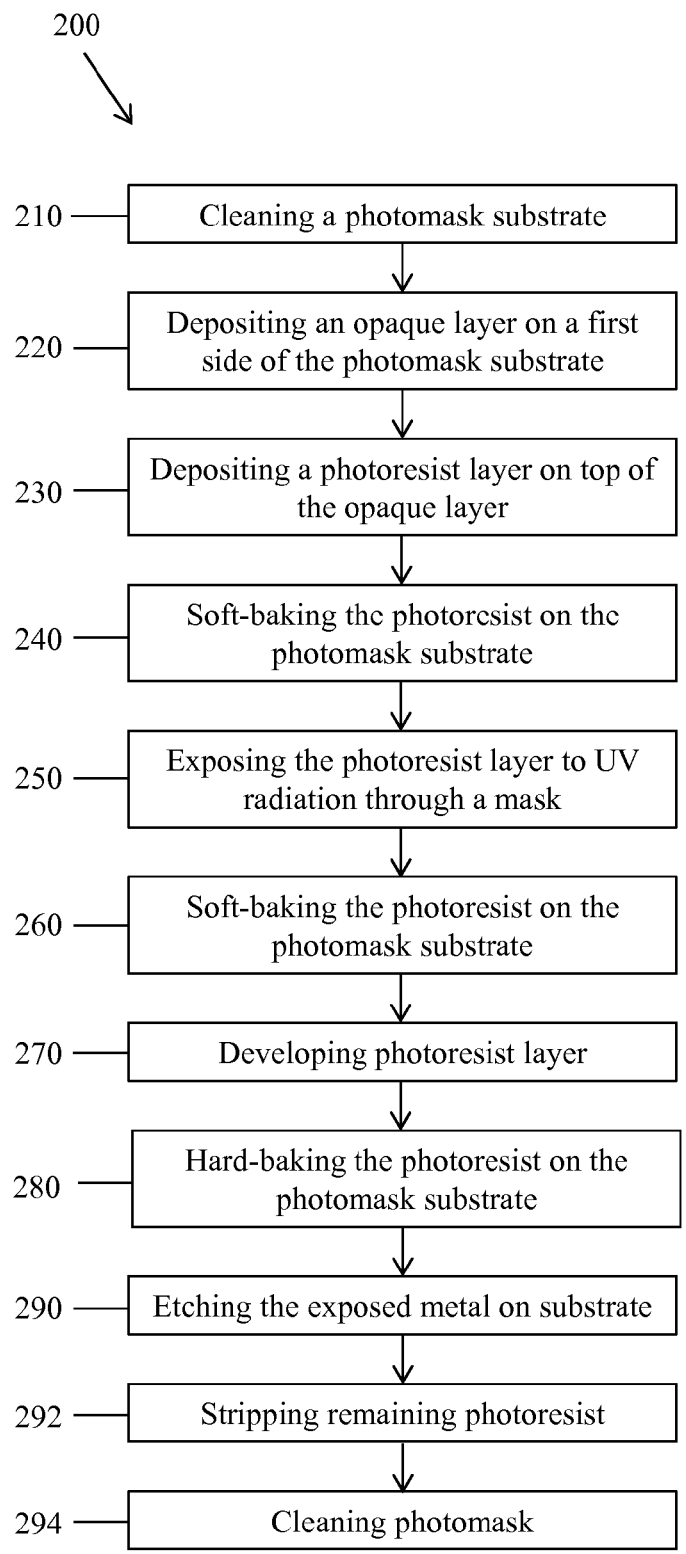
FIG. 2 shows a method of manufacturing a conventional photomask.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one of ordinary skill in the art are not described to avoid obscuring the description of the present invention.

FIG. 1 shows a cross-sectional view of a conventional photomask at different stages of manufacture. In FIG. 1A, a photomask substrate 110 serves as a base layer for a photomask (100 of FIG. 1D). Photomask substrate 110 is a rigid, flat, and transparent plate composed of glass or quartz. An opaque layer 120 is disposed on a first side of photomask substrate 110. Opaque layer 120 is a layer opaque to Ultraviolet ("UV") radiation composed of chromium, chromium oxide, iron oxide, or aluminum. A photoresist layer 130 is deposited on top of opaque layer 120. Photoresist layer 130 is a photoactive layer composed of a resin, a photoactive compound, and a solvent. In FIG. 1, photoresist layer 130 is a positive photoresist material. Other applications may use negative photoresist in a similar manner. A mask 140 includes an opaque surface with a plurality of open or transparent portions that form a patterned design (not independently illustrated) to be transferred to photoresist layer 130. The patterned design is provided to the fabricator of the photomask in advance of fabrication of the conventional photomask. UV radiation 150 incident on mask 140 passes through open portions of mask 140 and exposes corresponding portions of photoresist layer 130.

Continuing in FIG. 1B, exposed portions of (positive) photoresist layer 130 are removed by a photoresist developer (not shown), leaving photomask substrate 110, opaque layer 120, and unexposed portions of photoresist layer 130. Continuing in FIG. 1C, physically exposed portions of opaque layer 120 are removed by a metal etchant or a suitable oxide etchant (not shown), leaving photomask substrate 110, physically unexposed portions of opaque layer 120, and unexposed portions of photoresist layer 130. Continuing in FIG. 1D, remaining portions of photoresist layer 130 are stripped by a photoresist solvent (not shown), leaving photomask substrate 110 and portions of opaque layer 120 that include a patterned design corresponding to mask 140. Photomask 100 may be used to replicate the patterned design of photomask 100 on one or more substrates (not shown) as part of a lithographic patterning process.

FIG. 2 shows a method of manufacturing a conventional photomask 100. A photomask substrate is a rigid, flat, and radiation transparent plate composed of glass or quartz. Because the photomask substrate is transparent, radiation incident on the photomask substrate may pass through the photomask substrate. In step 210, the photomask substrate is cleaned and baked to remove organic contaminates and moisture. Contamination may cause adhesion problems between the photomask substrate and an opaque layer deposited on a surface of the photomask substrate. The photomask substrate may be cleaned with a plasma treatment or other treatment process. In step 220, the opaque layer is deposited on a first side of the photomask substrate. The opaque layer may be composed of chromium, chromium oxide, iron oxide, or aluminum. Because the opaque layer is opaque, radiation incident on the opaque layer does not pass through the opaque layer.

In step 230, the photoresist layer is deposited on top of the opaque layer by a spin coating process, slot dye coating process, spray coating process, or other deposition process. The photoresist layer may be positive photoresist material or negative photoresist material, depending on an application. In step 240, after deposition of the photoresist layer, the photomask substrate may be soft-baked to prepare the photoresist layer for exposure to UV radiation. Soft-baking may include exposure to heat at a temperature in a range between approximately 80 degrees Celsius and approximately 120 degrees Celsius for a period of time in a range between approximately 1 minute and approximately 2 minutes. After soft-baking, the photomask substrate is allowed to cool to a uniform temperature.

In step 250, the photoresist layer is exposed to UV radiation through a mask. The mask includes an opaque surface with a plurality of open or radiation transparent portions that form a patterned design to be transferred to the photoresist layer. The radiation incident on the mask passes through the open portions of the mask and exposes corresponding portions of the photoresist layer. In step 260, after exposure, the photomask substrate may be soft-baked. Soft-baking may include exposure to heat at a temperature in a range between approximately 80 degrees Celsius and approximately 120 degrees Celsius for a period of time in a range between approximately 30 seconds to approximately 1 minute. In step 270, the photoresist layer is developed with a photoresist developer. In positive photoresist applications, the photoresist developer dissolves the exposed portions of the photoresist layer. In negative photoresist applications, the photoresist developer dissolves the unexposed portions of the photoresist layer. In step 280, the photoresist layer is hard-baked to stabilize the sidewalls from undercut. Hard-baking includes exposure to heat at a temperature in a range between approximately 10 degrees Celsius and approximately 20 degrees Celsius above the soft-bake temperature for a period of time in a range between approximately 30 seconds and approximately 1 minute.

In step 290, physically exposed portions of the opaque layer, not covered by remaining portions of the photoresist layer, are removed by a metal or oxide etchant. The metal or oxide etchant may be composed of an acid suitable to remove the type of material used as part of the opaque layer. In step 292, the remaining portions of the photoresist layer are stripped by a photoresist solvent. The photoresist solvent may be acetone or a stripping compound recommended by the supplier of the photoresist. In step 294, after etching, the photomask may be cleaned with deionized water. The photomask includes a photomask substrate and portions of the opaque layer forming a patterned design corresponding to the mask. In operation, the photomask may be used to replicate a patterned design of the photomask on one or more substrates.

The method of manufacturing a conventional photomask is complicated, time-consuming, expensive to implement, and is limited to small-area photomasks. The conventional method produces substantial waste including acids and chemicals that require appropriate disposal. Because of the processes and materials used, conventional photomasks are limited to applications suitable for use with rigid and small-area photomasks.

Figure 3:
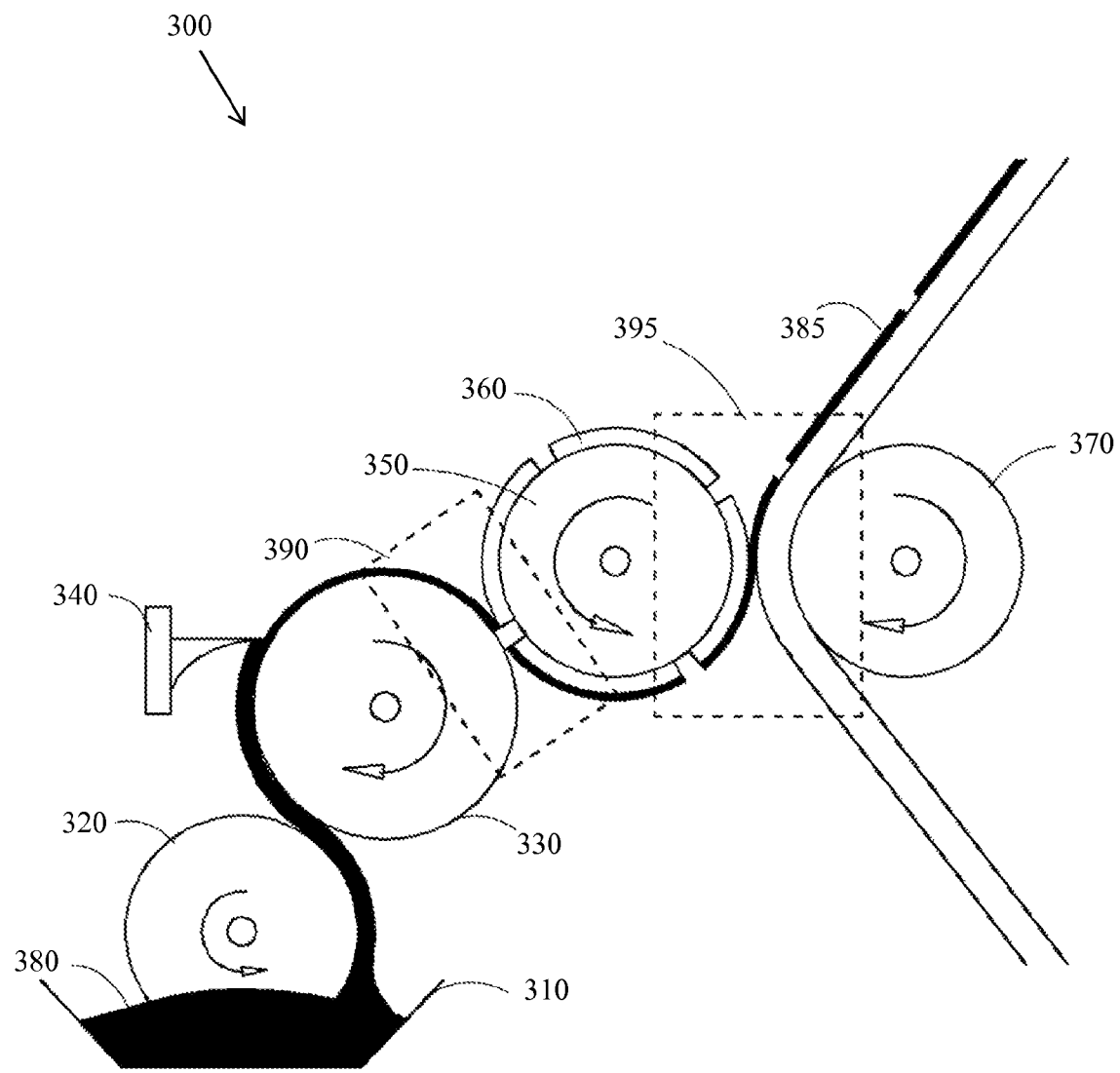
FIG. 3 shows a flexographic printing system in accordance with one or more embodiments of the present invention.

FIG. 3 shows a flexographic printing system in accordance with one or more embodiments of the present invention. Flexographic printing system 300 may include an ink pan 310, an ink roll 320 (also referred to as a fountain roll), an anilox roll 3130 (also referred to as a meter roll), a doctor blade 340, a printing plate cylinder 350, a flexographic printing plate 360, and an impression cylinder 370.

In operation, ink roll 320 transfers ink 380 from ink pan 310 to anilox roll 330. In one or more embodiments of the present invention, ink 380 may be an opaque ink or other opaque material suitable for flexographic printing. One of ordinary skill in the art will recognize that the composition of ink 380 may vary in accordance with one or more embodiments of the present invention. Anilox roll 330 is typically constructed of a steel or aluminum core that may be coated by an industrial ceramic whose surface contains a plurality of very fine dimples, known as cells (not shown). Doctor blade 340 removes excess ink 380 from anilox roll 330. In transfer area 390, anilox roll 330 meters the amount of ink 380 transferred to flexographic printing plate 360 to a uniform thickness. Printing plate cylinder 350 may be generally made of metal and the surface may be plated with chromium, or the like, to provide increased abrasion resistance. Flexographic printing plate 360 may be mounted to printing plate cylinder 350 by an adhesive (not shown).

One or more photomask substrates 385 move between printing plate cylinder 350 and impression cylinder 370. In one or more embodiments of the present invention, photomask substrate 385 may be transparent. Transparent means the transmission of visible light with a transmittance rate of 85% or more. In one or more embodiments of the present invention, photomask substrate 385 may be polyethylene terephthalate ("PET"), polyethylene naphthalate ("PEN"), cellulose acetate ("TAC"), linear low-density polyethylene ("LLDPE"), high-density polyethylene ("HDPE"), bi-axially-oriented polypropylene ("BOPP"), polyester, polypropylene, or glass. One of ordinary skill in the art will recognize that the composition of photomask substrate 385 may vary in accordance with one or more embodiments of the present invention. Impression cylinder 370 applies pressure to printing plate cylinder 350, transferring an image from embossing patterns of flexographic printing plate 160 onto photomask substrate 385 at transfer area 395. The rotational speed of printing plate cylinder 350 is synchronized to match the speed at which substrate 385 moves through flexographic printing system 300. The speed may vary between 20 feet per minute to 750 feet per minute.

Figure 4:
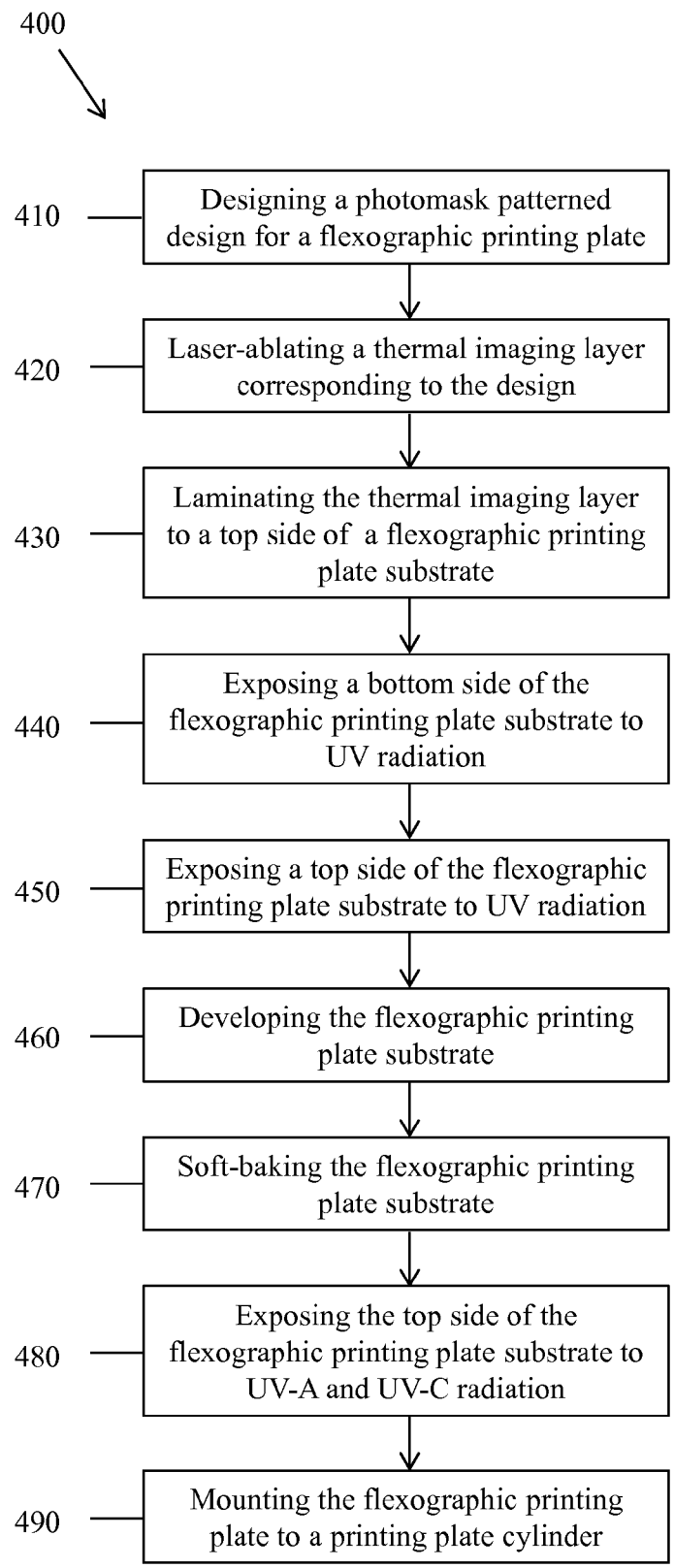
FIG. 4 shows a method of manufacturing a flexographic printing plate in accordance with one or more embodiments of the present invention.

FIG. 4 shows a method of manufacturing a flexographic printing plate in accordance with one or more embodiments of the present invention. In step 410, a photomask patterned design may be designed in a software application, such as a computer-aided drafting ("CAD") software application. The photomask patterned design includes a pattern to be patterned into a flexographic printing plate that, when used as part of a flexographic printing process, prints a corresponding photomask patterned design on a substrate. In one or more embodiments of the present invention, the photomask patterned design may include one or more lines or features having a width in a range between approximately 100 nanometers and approximately 10,000 nanometers. In one or more embodiments of the present invention, the photomask patterned design may include one or more lines or features having a width in a range between approximately 10,000 nanometers and approximately 50,000 nanometers. In one or more embodiments of the present invention, the photomask patterned design may include one or more lines or features having a width larger than approximately 50,000 nanometers. One of ordinary skill in the art will recognize that the photomask patterned design may vary based on an application in accordance with one or more embodiments of the present invention.

In step 420, a thermal imaging layer may be laser-ablated based on the photomask patterned design of step 410. The CAD software application may output the photomask patterned design to a standardized file format, such as Tagged File Format ("TIF"), used by commercially available thermal imaging systems. The TIF file may be input to a thermal imaging system. The thermal imaging layer may include a PET base layer covered by a photoactive layer. The thermal imaging system laser-ablates portions of the photoactive layer corresponding to the photomask patterned design corresponding to the projected TIF image, leaving the PET base layer and remaining portions of the photoactive layer that form an outline of the photomask patterned design.

In step 430, the laser-ablated thermal imaging layer may be laminated to a flexographic printing plate substrate. The flexographic printing plate substrate may be composed of a flexible photopolymer. The flexographic printing plate may have a length, a width, and a thickness determined by an application. In certain embodiments, the flexographic printing plate may have a length, a width, and a thickness suitable for mounting to an 18 inch printing plate cylinder. In other embodiments, the flexographic printing plate may have a length, a width, and a thickness suitable for mounting to a 24 inch printing plate cylinder. One of ordinary skill in the art will recognize that a length, a width, and a thickness of the flexographic printing plate may vary based on an application in accordance with one or more embodiments of the present invention.

In step 440, a bottom side of the flexographic printing plate substrate, opposite a top side where the thermal imaging layer is laminated, may be exposed to UV-A radiation. In certain embodiments, the bottom side of the flexographic printing plate substrate may be exposed to UV-A radiation for an exposure time in a range between approximately 5 seconds and approximately 60 seconds, depending on the desired relief depth. In other embodiments, the bottom side of the flexographic printing plate substrate may be exposed to UV-A radiation for an exposure time corresponding to a desired relief depth. In step 450, a top side of the flexographic printing plate substrate, that includes the laminated thermal imaging layer, may be exposed to UV-A radiation. The UV-A radiation passes through the laser-ablated portions of the thermal imaging layer that correspond to the photomask patterned design. In certain embodiments, the top side of the flexographic printing plate may be exposed to UV-A radiation for an exposure time in a range between approximately 300 seconds and approximately 1200 seconds. In other embodiments, the top side of the flexographic printing plate substrate may be exposed to UV-A radiation for an exposure time corresponding to the desired relief depth. After exposure, the thermal imaging layer is removed.

In step 460, the flexographic printing plate substrate may be developed with a washout solvent. The washout solvent dissolves top side portions of the flexographic printing plate substrate that were not exposed to UV radiation, leaving the UV exposed portions corresponding to the photomask patterned design. In step 470, the flexographic printing plate substrate may be soft-baked. After development with the washout solvent, the flexographic printing plate substrate may be wet and too flexible. Soft-baking hardens the flexographic printing plate substrate to a certain extent, but the substrate remains flexible. In one or more embodiments of the present invention, the flexographic printing plate substrate may be soft-baked at a temperature in a range between approximately 50 degrees Celsius and approximately 60 degrees Celsius for a period of time in a range between approximately 45 minutes and approximately 1 hour.

In step 480, the top side of the flexographic printing plate substrate may be exposed to UV-A radiation to strengthen and polymerize any incompletely polymerized sections of the plate followed by UV-C radiation to remove organic contaminates from the surface of the plate. In certain embodiments, the top side of the flexographic printing plate may be exposed to UV-A radiation for an exposure time in a range between approximately 1 minute and approximately 3 minutes followed by exposure to UV-C radiation for an exposure time in a range between approximately 1 minute and approximately 20 minutes. One or ordinary skill in the art will recognize that the exposure time of UV-A and UV-C radiation may vary based on an application in accordance with one or more embodiments of the present invention.

In step 490, the flexographic printing plate may be mounted to a printing plate cylinder. After soft-baking and complete curing, the developed flexographic printing plate substrate may be a flexographic printing plate suitable for use in a flexographic printing process used to create one or more photomasks. The flexographic printing plate includes one or more embossing patterns, or raised projections, corresponding to the photomask patterned design. The embossing patterns have distal ends onto which ink or other material may be disposed as part of the flexographic printing process. The flexographic printing plate, that includes the photomask patterned design, may be mounted to the printing plate cylinder by an adhesive backing tape that secures the flexographic printing plate to the printing plate cylinder. The flexographic printing plate, mounted to the printing plate cylinder, may be used as part of flexographic printing system 300.

Figure 5:
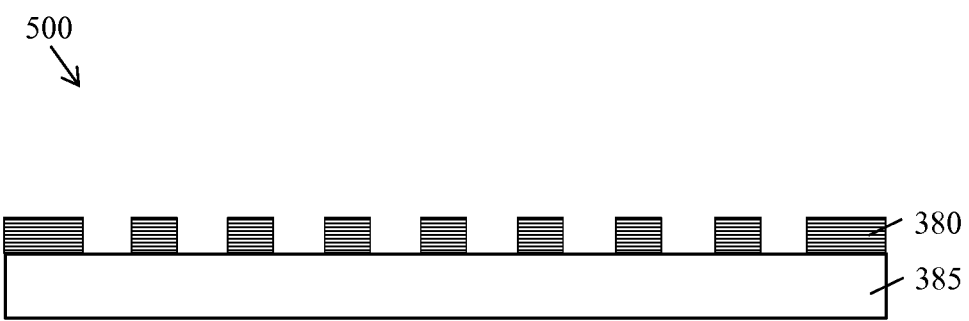
FIG. 5 shows a cross-sectional view of a photomask in accordance with one or more embodiments of the present invention.

FIG. 5 shows a cross-sectional view of a photomask 500 in accordance with one or more embodiments of the present invention. Photomask 500 may be manufactured in accordance with the method of FIG. 6 by flexographic printing system 300 described above with reference to FIG. 3. Photomask 500 includes photomask substrate 385 and a photomask patterned design printed on substrate 385 with an opaque ink or other material 380. In one or more embodiments of the present invention, photomask substrate 385 may be PET, PEN, TAC, LLDPE, HDPE, BOPP, polyester, polypropylene, or glass. In certain embodiments, photomask substrate 385 is flexible, transparent, and compatible with a roll-to-roll flexographic printing process, where the substrates may be flexible films of the above-noted materials. As such, photomask 500 may have a length, a width, and a thickness limited only by the flexographic printing process. Thus, photomask 500 may be substantially larger than a conventional photomask manufactured according to a conventional photomask manufacturing method.

The photomask patterned design (not independently illustrated) is printed directly on photomask substrate 385 with an opaque ink or other material 380. As such, photomask 500 does not require the use of an opaque layer, metal masks, or an acid-based metal or oxide etchants. In one or more embodiments of the present invention, the printed photomask patterned design may include one or more lines or features having a width in a range between approximately 100 nanometers and approximately 10,000 nanometers. In one or more embodiments of the present invention, the printed photomask patterned design may include one or more lines or features having a width in a range between approximately 10,000 nanometers and approximately 50,000 nanometers. In one or more embodiments of the present invention, the printed photomask patterned design may include one or more lines or features having a width larger than approximately 50,000 nanometers. Photomask 500 may be used in any application in which a conventional photomask may be used and may be used in other applications in which a conventional photomask may not be used.

Figure 6:
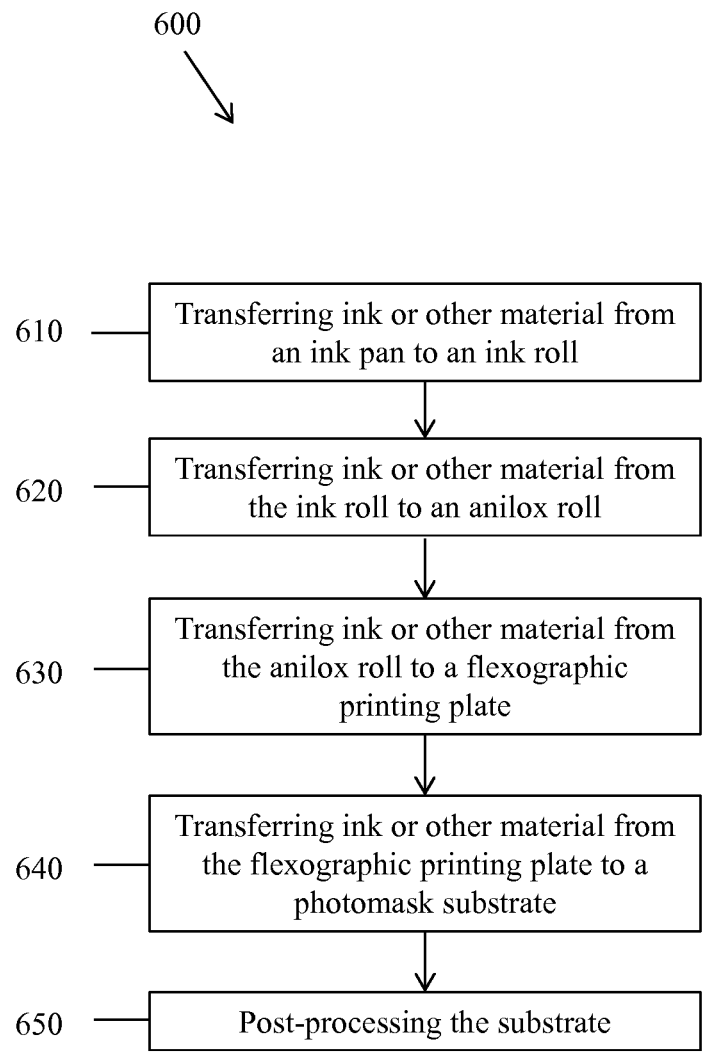
FIG. 6 shows a method of manufacturing a photomask in accordance with one or more embodiments of the present invention.

FIG. 6 shows a method of manufacturing a photomask 500 in accordance with one or more embodiments of the present invention. Photomask 500 may be manufactured by a flexographic printing system 300 that includes a flexographic printing plate 360 manufactured in accordance with FIG. 4. In step 610, an opaque ink or other material (380 of FIG. 3) may be transferred from an ink pan (310 of FIG. 3) to an ink roll (320 of FIG. 3). In one or more embodiments, ink (380 of FIG. 3) may be an opaque ink or other material. One of ordinary skill in the art will recognize that the composition of the ink or other material (380 of FIG. 3) may vary in accordance with one or more embodiments of the present invention. In step 620, the ink or other material (380 of FIG. 3) may be transferred from the ink roll (320 of FIG. 3) to an anilox roll (330 of FIG. 3). Excess ink or other material (380 of FIG. 3) may be removed by from the anilox roll (330 of FIG. 3) by a doctor blade (340 of FIG. 3).

In step 630, the ink or other material (380 of FIG. 3) may be transferred from the anilox roll (330 of FIG. 3) to a flexographic printing plate (360 of FIG. 3). The flexographic printing plate (360 of FIG. 3) may be manufactured in accordance with the method of FIG. 4 and mounted to a printing plate cylinder (350 of FIG. 3) for use in a flexographic printing system (300 of FIG. 3). The flexographic printing plate (360 of FIG. 3) includes one or more embossing patterns, or raised projections, corresponding to the photomask patterned design (not independently illustrated). The embossing patterns have distal ends onto which the ink or other material (380 of FIG. 3) may be disposed as part of the flexographic printing process. In one or more embodiments of the present invention, the embossing patterns may include one or more lines or features having a width in a range between approximately 100 nanometers and approximately 10,000 nanometers. In one or more embodiments of the present invention, the embossing patterns may include one or more lines or features having a width in a range between approximately 10,000 nanometers and approximately 50,000 nanometers. In one or more embodiments of the present invention, the embossing patterns may include one or more lines or features having a width larger than approximately 50,000 nanometers.

In step 640, the ink or other material (380 of FIG. 3) may be transferred from the flexographic printing plate (360 of FIG. 3) to a photomask substrate (385 of FIG. 3). In one or more embodiments of the present invention, the photomask substrate (385 of FIG. 3) may be PET, PEN, TAC, LLDPE, HDPE, BOPP, polyester, polypropylene, or glass. In certain embodiments, the photomask substrate (385 of FIG. 3) is flexible, transparent, and compatible with a roll-to-roll flexographic printing process. One of ordinary skill in the art will recognize that other substrate materials may be used in accordance with one or more embodiments of the present invention. In step 650, the photomask substrate (385 of FIG. 3) may be post-processed. Post-processing may include cutting out the photomask (500 of FIG. 5) out from the photomask substrate (385 of FIG. 3), curing the photomask (500 of FIG. 5), and cleaning the photomask (500 of FIG. 5). After manufacture, the photomask (500 of FIG. 5) may be used to replicate a photomask patterned design on one or more substrates (not independently illustrated).

Advantages of one or more embodiments of the present invention may include one or more of the following:

In one or more embodiments of the present invention, a method of manufacturing a photomask produces a photomask using a roll-to-roll flexographic printing process.

In one or more embodiments of the present invention, a method of manufacturing a photomask may use roll-to-roll photomask substrate material.

In one or more embodiments of the present invention, a method of manufacturing a photomask may produce a large area photomask.

In one or more embodiments of the present invention, a method of manufacturing a photomask does not require opaque layers, metal masks, or acid based metal or oxide etchants.

In one or more embodiments of the present invention, a method of manufacturing a photomask reduces photomask manufacturing costs.

In one or more embodiments of the present invention, a method of manufacturing a photomask simplifies photomask manufacturing processes.

In one or more embodiments of the present invention, a method of manufacturing a photomask improves photomask manufacturing efficiency.

In one or more embodiments of the present invention, a method of manufacturing a photomask reduces photomask manufacturing waste.

In one or more embodiments of the present invention, a method of manufacturing a photomask may produce a larger area photomask than a conventional method of manufacturing a photomask.

In one or more embodiments of the present invention, a method of manufacturing a photomask is less expensive than a conventional method of manufacturing a photomask.

In one or more embodiments of the present invention, a method of manufacturing a photomask is less complicated than a conventional method of manufacturing a photomask.

In one or more embodiments of the present invention, a method of manufacturing a photomask is more efficient than a conventional method of manufacturing a photomask.

In one or more embodiments of the present invention, a method of manufacturing a photomask produces less waste than a conventional method of manufacturing a photomask.

In one or more embodiments of the present invention, a method of manufacturing a photomask is compatible with flexographic printing processes.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. A method of manufacturing a photomask with flexography comprising:
   manufacturing a flexographic printing plate comprising a photomask patterned design;
   transferring opaque ink from an ink pan to an ink roll;
   transferring opaque ink from the ink roll to an anilox roll;
   transferring opaque ink from the anilox roll to the flexographic printing plate comprising the photomask patterned design; and
   transferring opaque ink from the flexographic printing plate to a photomask substrate.

2. The method of claim 1, wherein manufacturing the flexographic printing plate comprising the photomask patterned design comprises:
   designing the photomask patterned design;
   laser-ablating the photomask patterned design into a thermal imaging layer;
   laminating the laser-ablated thermal imaging layer to a top side of a flexographic printing plate substrate;
   exposing a bottom side of the flexographic printing plate substrate to UV-A radiation;
   exposing the top side of the flexographic printing plate substrate to the UV-A radiation;
   removing the thermal imaging layer; and
   developing the flexographic printing plate substrate.

3. The method of claim 2, further comprising:
   soft-baking the flexographic printing plate substrate.

4. The method of claim 2, further comprising:
   exposing the top side of the flexographic printing plate substrate to UV-A radiation.

5. The method of claim 2, further comprising:
   exposing the top side of the flexographic printing plate substrate to UV-C radiation.

6. The method of claim 2, wherein the photomask patterned design comprises one or more lines having a width in a range between 100 nanometers and 10,000 nanometers.

7. The method of claim 2, wherein the photomask patterned design comprises one or more lines having a width in a range between 10,000 nanometers and 50,000 nanometers.

8. The method of claim 2, wherein the photomask patterned design comprises one or more lines having a width larger than 50,000 nanometers.

9. The method of claim 2, wherein the bottom side of the flexographic printing plate substrate is exposed for a period of time in a range between 5 seconds and 60 seconds.

10. The method of claim 2, wherein the top side is exposed for a period of time in a range between 300 seconds and 1200 seconds.

* * * * *